(12) United States Patent
Amstutz et al.

(10) Patent No.: US 8,674,761 B2
(45) Date of Patent: Mar. 18, 2014

(54) DIGITAL CHARGE AMPLIFIER AND METHOD FOR CONVERTING CHARGE SIGNALS INTO DIGITAL SIGNALS

(75) Inventors: Leo Amstutz, Neftenbach (CH); Kurt Neff, Seuzach (CH); Daniel Otter, Bruetten (CH)

(73) Assignee: Kistler Holding AG, Winterthur (CH)

( * ) Notice: Subject to any disclaimer, the term of this patent is extended or adjusted under 35 U.S.C. 154(b) by 64 days.

(21) Appl. No.: 13/511,713

(22) PCT Filed: Nov. 18, 2010

(86) PCT No.: PCT/CH2010/000289
§ 371 (c)(1),
(2), (4) Date: May 24, 2012

(87) PCT Pub. No.: WO2011/063536
PCT Pub. Date: Jun. 3, 2011

(65) Prior Publication Data
US 2012/0268202 A1     Oct. 25, 2012

(30) Foreign Application Priority Data
Nov. 25, 2009 (CH) .................................. 1814/09

(51) Int. Cl.
*G01R 1/30* (2006.01)
(52) U.S. Cl.
USPC .................................................... 330/174

(58) Field of Classification Search
USPC .......................... 330/174, 59, 69, 86
See application file for complete search history.

(56) References Cited

U.S. PATENT DOCUMENTS

| | | | |
|---|---|---|---|
| 3,921,012 A | 11/1975 | Marshall, III | |
| 3,989,961 A | 11/1976 | Masreliez | |
| 4,109,168 A | 8/1978 | Raymond | |
| 4,418,335 A * | 11/1983 | Genahr | 340/565 |
| 5,523,642 A | 6/1996 | Hashimoto et al. | |
| 7,822,349 B2 * | 10/2010 | Roosli et al. | 398/202 |

OTHER PUBLICATIONS

International Search Report on Patentability, issued Apr. 2, 2011.
English Translation of International Preliminary Report on Patentability, issued Jun. 7, 2012.

* cited by examiner

*Primary Examiner* — Steven J Mottola
(74) *Attorney, Agent, or Firm* — Dority & Manning, P.A.

(57) ABSTRACT

A circuit for a charge amplifier for converting piezoelectric measurement signals continuously sets the output signal of the amplifier to a value close to zero, such that a reset switch becomes unnecessary. The amplifier includes a pulse generator that provides the output signal of the amplifier in the form of pulses, which are easy to transmit with low interference. The pulse frequency is proportional to the rate of change of charge. The pulses, which are added in a counter, represent a value proportional to the change in the charge since the last counter reset, which is proportional to the present measured value at the measurement element.

13 Claims, 5 Drawing Sheets

PRIOR ART

DIGITAL CHARGE AMPLIFIER AND METHOD FOR CONVERTING CHARGE SIGNALS INTO DIGITAL SIGNALS

CROSS-REFERENCE TO RELATED APPLICATIONS

This application claims priority to International Application Serial No. PCT/CH2010/000289 filed Nov. 18, 2010, which claims priority to Swiss Application No. CH 1814/09 filed Nov. 25, 2009.

FIELD OF THE INVENTION

The invention relates to a charge amplifier circuit for converting positive and negative charge signals Q that are output by a piezoelectric measuring element into a digital signal D which is proportional to the present measured value at the measuring element, comprising a charge amplifier V1 having a charge input and a voltage output for converting the detected charge Q into a voltage U2. The invention further relates to a method for converting charge signals into digital signals D.

BACKGROUND

Charge amplifiers are required in particular in connection with piezoelectric sensors, since these output their measured values in the form of charges. Such sensors detect for example forces, pressures, accelerations, expansions, moments and related physical phenomena. Once such sensors are mounted on movable parts, for example on wheels of vehicles, the measurement signals are digitalised, in order to be able to be transmitted to a stator by means of contact-free transmission. For this purpose, the determined measurements are typically amplified in a charge amplifier and, by means of analogue-digital converters (A/D converters), converted until they are finally transmitted.

As a result of unavoidable interference currents at the amplifier input, which have the same effect as the currents originating from the changes in the charge Q, the amplifier output voltage moves from its original value; it drifts. In order to reduce this interference effect, a resistor is often connected in parallel with the charge amplifier, which limits the increase in the output voltage due to drift to an acceptable level. The resistor also acts on the measurement signal in a similar manner, however. The lower cut-off frequency of the charge amplifier therefore also often increases to values which can no longer be tolerated. If the measurement procedure only detects a brief single event, this interference effect can be counteracted by activating a reset switch shortly before the measurement procedure. In the case of longer measurement procedures, the choice of the value of resistor frequently leads to an unsatisfactory compromise between a resulting lower cut-off frequency and the residual drift of the charge amplifier. In addition, in the case of contact-free transmission of the measured value, for example with a moving measurement object, additional effort is necessary to activate the reset switch from of the fixed electronics.

BRIEF SUMMARY OF THE INVENTION

The object of the present invention is to specify a circuit for a charge amplifier for converting piezoelectric measurement signals, which reduces the problems mentioned and also supplies a signal without the use of an analogue/digital converter, which can be easily transmitted by contact-free means.

The idea of the invention is that the output signal of the amplifier is continuously set to a value close to zero, such that a reset switch becomes unnecessary. In addition, the output signal is provided in the form of pulses, which are easy to transmit with low interference. The pulse frequency is proportional to the rate of change of charge. The pulses, which are added in a counter, represent a value proportional to the change in the charge since the last counter reset, which is proportional to the present measured value at the measurement element.

BRIEF DESCRIPTION OF THE DRAWINGS

Below, the invention is described in more detail by reference to the drawings. They show.

DESCRIPTION OF EXEMPLARY EMBODIMENTS OF THE INVENTION

Figure 1:
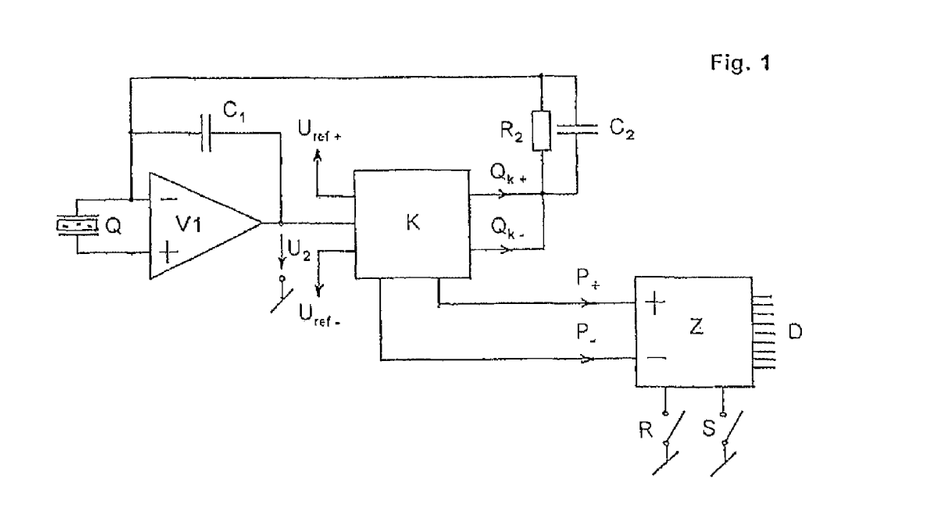
FIG. 1 a schematic illustration of a circuit according to the invention.

FIG. 1 shows a simplified illustration of the functioning of a charge amplifier circuit according to the invention. The charge Q to be detected, generated by a piezoelectric measurement element, is applied at the input of an amplifier V1 with a feedback capacitor C1. As soon as the amplifier output voltage U2 exceeds or falls below the reference value Uref+ or Uref− respectively, the compensation circuit K supplies defined compensation charges Qk+ or Qk− via the network R2/C2 to the amplifier input until such time as its output voltage U2 again lies within the limits Uref+ and Uref−. With each positive charge unit Qk+ a pulse P− is output, and with each negative charge unit Qk− a pulse P+.

These pulses are incremental signals for the charge changes at the input of V1, or for the input current.

Summing these pulses in an up-/down counter Z produces a measure of the total charge previously input and ultimately supplies the desired digital signal D, which is proportional to the measured value currently present at the measurement element. Preferably, this signal D is a voltage signal.

This circuit is particularly advantageous in the processing of digital measurements and in measurements on moving objects, due to the simple facility for transmitting the pulses.

Figure 2:
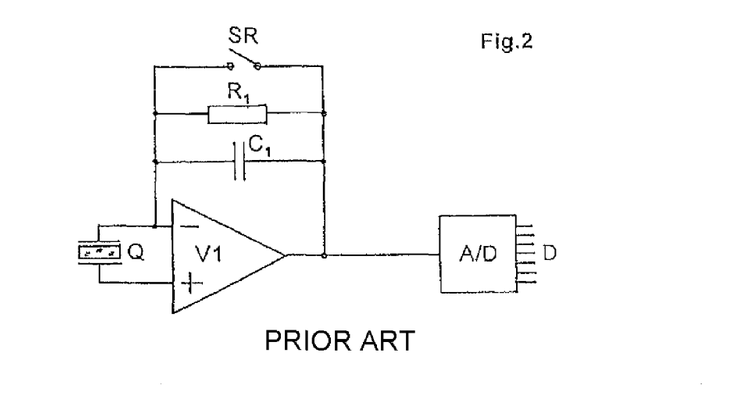
FIG. 2 a circuit for processing a charge signal according to the prior art.

A typical circuit for processing a charge signal according to the prior art, as is found for example in piezoelectric measurement technology, is shown in FIG. 2. A piezoelectric measurement element is connected as a charge source Q to the input of an integrating amplifier V1, in this application usually referred to as a charge amplifier. In parallel with this charge amplifier V1, a capacitor C1 and a reset switch SR are connected. By closing the reset switch SR the capacitor C1 is discharged. After this switch is opened, a charge Q applied after this time reaches the capacitor C1 and induces a voltage at the amplifier output, which has the value Q/C1. If a digital signal D is required, then the amplifier output voltage is fed to an analogue/digital converter A/D, at the output of which a parallel or serial signal D is then available.

A resistor R1, which is connected in parallel with the capacitor C1, is intended to limit the increase in the output voltage due to drift to an acceptable level.

Figure 3:
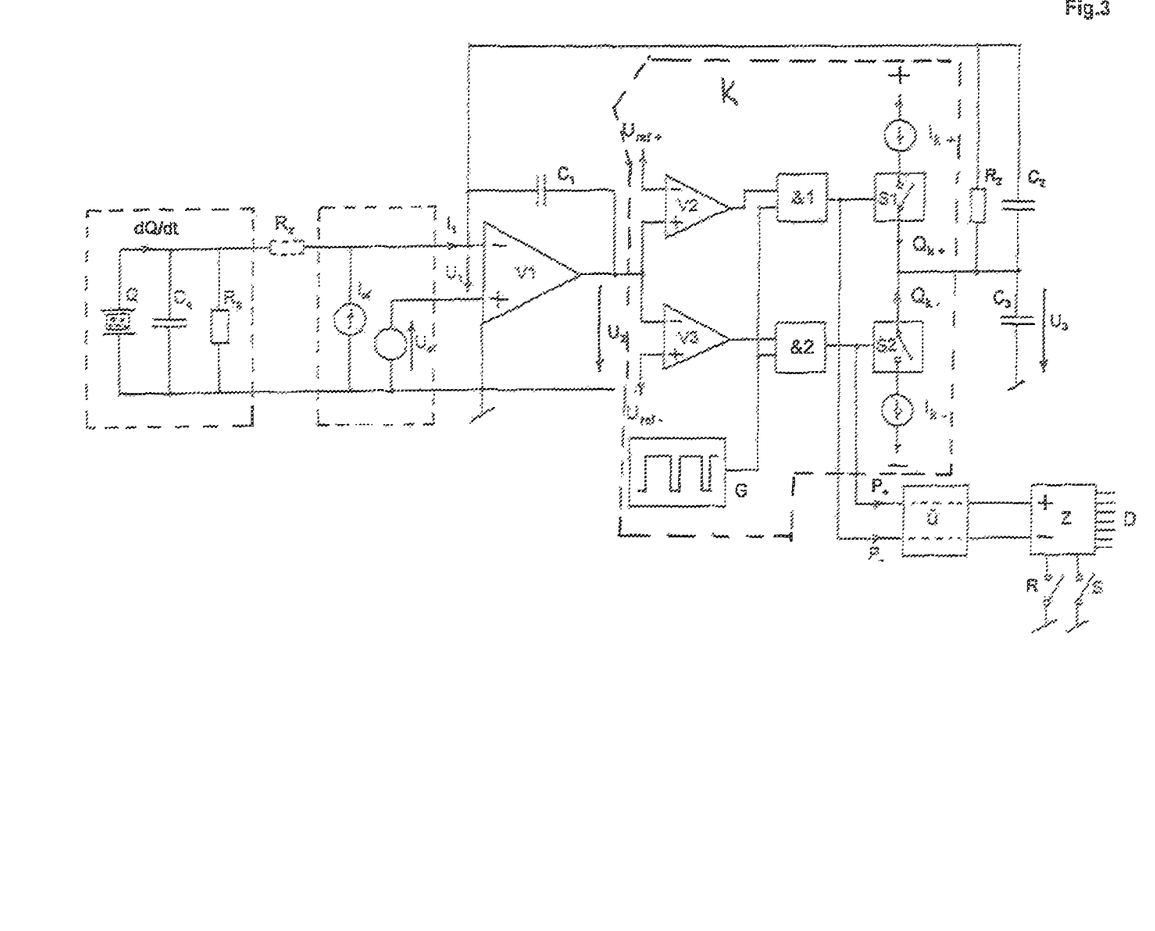
FIG. 3 a schematic illustration of a circuit according to the invention in an exemplary embodiment with pulsed compensation current.

FIG. 3 shows an exemplary embodiment of a circuit according to the invention in simplified form. The components in front of the amplifier V1 represent the parts that are present in every piezoelectric measurement device. Q is the charge source, generated by the piezoelectric measurement element, dQ/dt represents the current flowing due to changes in Q. Cq is intended to include the total capacitance, Rq the total leakage resistance of the input circuit, comprising charge source, cables and amplifier input. Iof is the offset current, Uof the voltage offset of the amplifier. I1 is the total current flowing from the source into the input of the amplifier, comprising the components arising from dQ/dt, Iof and Uof/Rq. In an output state of U2=0 an input current I1 first induces a very small input voltage U1 at the input of the amplifier V1 and an output voltage U2, which has the value of the integral of the current I1 over the time, divided by the capacitance C1. If U2 exceeds the value Uref+0 for negative charge increase at the input), the comparator amplifier V2 responds and supplies a positive output signal. From the pulse generator G, pulses of exactly defined width arrive at the two AND gates &1 and &2. As long as the output voltage of V2 is positive, these pulses arrive at the output of the AND gate &1. They activate the switch S1, which opens the current source Ik+ during each pulse duration. Due to this, with every pulse a well-defined compensation charge Qk+, which is equal to the value of the compensation current source Ik+ multiplied by the pulse duration, arrives at the network R2, C2, C3. This charge Qk reaches the amplifier input and compensates at least a part of the charge output by the source to V1. When after a sufficient number of compensation charges the input charge Q is almost completely compensated, U2 again falls below the value Uref+, whereby the following pulses from G can no longer pass through the AND gate &1. The pulses output by the AND gate also reach the output as pulses P. The number of these pulses is equal to the charge that has flowed to the input divided by the compensation charge Qk and is therefore a measure of the input signal. If Q has the opposite sign (positive charge increase), V3, the AND gate &2, S2 and Ik− start to function in an analogous way and induce output pulses P+.

These pulses are incremental signals which are proportional to the charge changes at the amplifier input. The frequency of the pulses P+ is a measure of the positive charge increase, and likewise the frequency of the pulses P− is a measure of the charge decrease.

Of most interest however is usually the integral of the change in charge from a particular instant. In this case the pulses are summed in an up-down counter. The pulses P+ and P− pass via a 2-channel transmission path Ü to arrive at the two inputs of a counter Z. This counter is initially set to zero by means of the reset switch R. At the beginning of the measurement process the counter is started by means of the switch S. If the measured value is to be fixed at a particular time, the counter can be stopped at this time and the signal is preserved in the counter regardless of drift effects in the amplifier V1. The value contained in the counter Z, proportional to the charge Q, can be read out in a known manner as a digital signal D in parallel or serially, and then further processed.

The source of interference at the amplifier input are due to physical phenomena and cannot be fully eliminated, since Iof and Uof, while certainly small, cannot be reduced to zero and hence the insulation resistance Rq always has a finite value. Even with this improved circuit therefore, genuine static measurements of the charge Q can never in fact be made, and the resistor R2 must have a finite value in order to dissipate the interference currents. However, an incremental signal which is easily transmitted without interference is present and a reset circuit on the charge amplifier is not even necessary. Rather, the counter can be set to zero at any time, easily and quickly.

In the case of abruptly changing signals (large increase in charge in a short time) the counter is advantageously set to zero in advance and started shortly before the expected step change in the signal.

In the case of periodic signals the counter can also be periodically set to zero in an event-driven manner, for example at the beginning of each periodic process.

Figure 6:
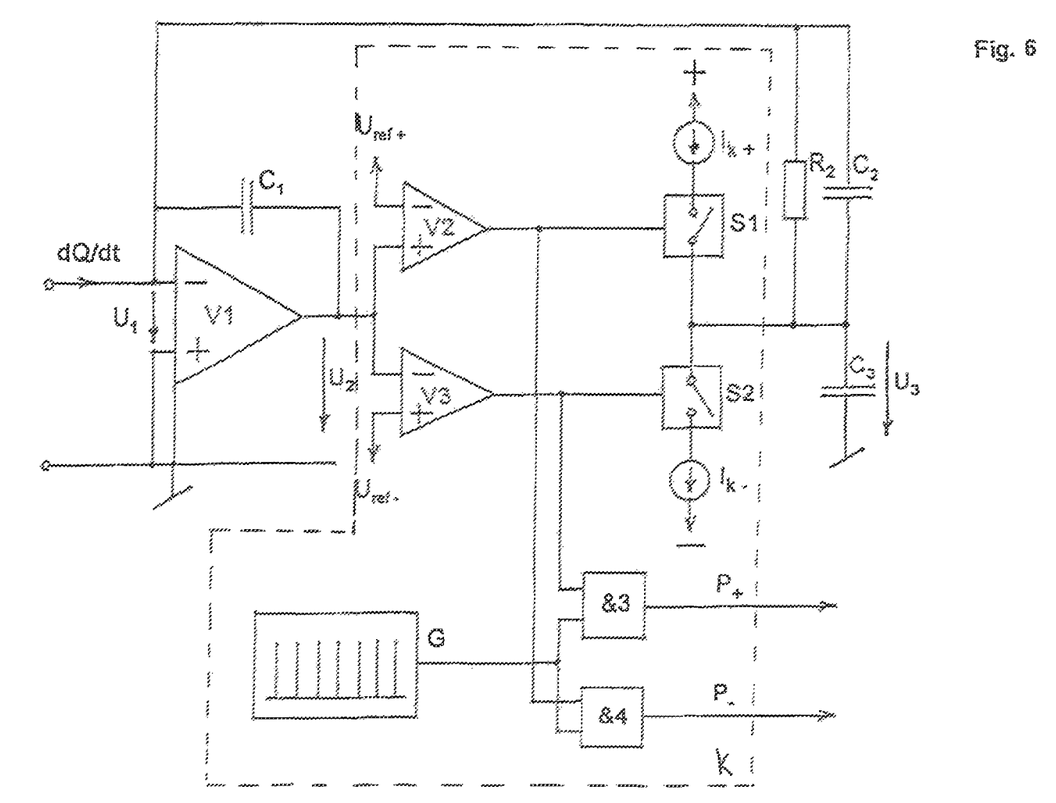
FIG. 6 a preferred embodiment of a circuit according to the invention with constant compensation current.

FIG. 6 shows a somewhat differently constructed circuit which has substantially the same function as the circuit described in FIG. 3.

It differs from this by the fact that with a positive output voltage of the amplifier V2 the switch S1 opens and supplies the compensation current Ik+ via the network R2/C2 to the amplifier input until such time as U2 again falls below the value Uref. The output voltage of V2 is also simultaneously applied to the AND gate &4, which during the time in which the compensation current Ik flows, outputs the pulses of the pulse generator G as output pulses P− to the output. The number of these pulses is therefore also proportional to the compensation charge and finally leads to the delivery of the digital signal D.

For positive changes of charge at the input, essentially the same applies to V3, S2 and &3. The switches S1 and S2 only switch the compensation currents.

From these explanations the following advantages of the invention with respect to conventional circuit types are evident in particular:

The measurement signal is directly incremental, and when using a counter, digital, without an intermediate analogue-digital converter.

A contact-free transmission of the signal is easily possible and with low levels of interference.

The zeroing of the measurement device can be performed on an external counter; on the charge amplifier itself no switching operations are necessary.

If the counter is stopped, the measurement signal is preserved for an arbitrary length of time.

Due to the fact that the voltage at the amplifier output, and thus also at the amplifier input, is usually only small, the effect of the insulation resistance, which is only of finite size, at the input is reduced.

Function of the Components and Dimensioning Instructions

Referring to FIG. 3 and FIG. 6

The frequency of the pulse generator G in the circuit according to FIG. 3 is to be chosen high enough so that the maximum expected step charge at the input is compensated within the time that corresponds to the permitted delay of the digital signal; the maximum possible frequency is determined by the chosen pulse width. In the circuit according to FIG. 6 the frequency of the pulse generator G must be high enough to both obtain a sufficient resolution of the measurement signal and to be able also to resolve the short compensation currents, caused by drift effects and other types of interference, sufficiently well such that no additional zero point drifts of the counter summing the P+ and P− pulses occur.

The reference voltage Uref must have at least the value Qk/C1 for reasons of stability, where Qk stands for the compensation charge unit of the circuit according to FIG. 3, or in the circuit according to FIG. 6, essentially the smallest charge delivered at the input in a compensation process, respectively.

Of particular interest is the special case in which R2 is chosen to be a low value, in the extreme case even R2=0 Ohm. Then, the compensation charges Qk pass directly to the amplifier input. The capacitors C2 and C3 no longer have any effect and can be omitted. The voltage U3 assumes approximately the value U1 and is therefore negligibly small.

Figure 4:
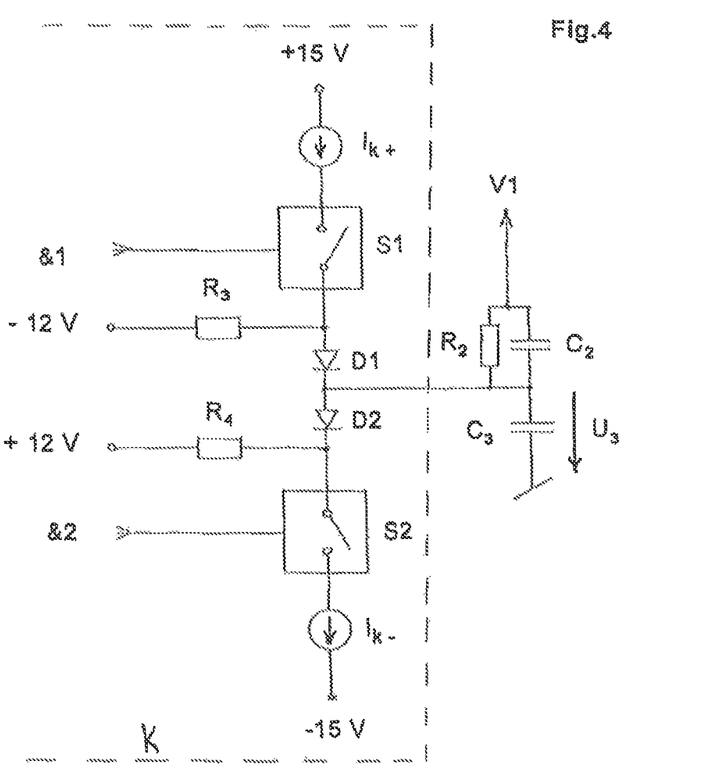
FIG. 4 a preferred embodiment using diodes.

FIG. 4 shows a part of the circuit diagram of FIG. 3, drawn with 4 additional components. The switches S1 and S2 are preferably embodied as semiconductor switches. If the leakage currents of these switches are unacceptably large, they can be reduced by high-impedance diodes D1 and D2 inserted in series with the switches. It can be advantageous to forward-bias the diodes by means of the resistors R3 and R4, in particular if R2 has a high impedance and U3 can then attain values diverging considerably from 0V. These resistors must then have somewhat lower impedance than the diodes, but high enough that the component of Ik flowing through it is negligibly small. In the example shown this circuit works as long as U3 does not exceed a value of |11 V|.

EXEMPLARY EMBODIMENT

Figure 5:
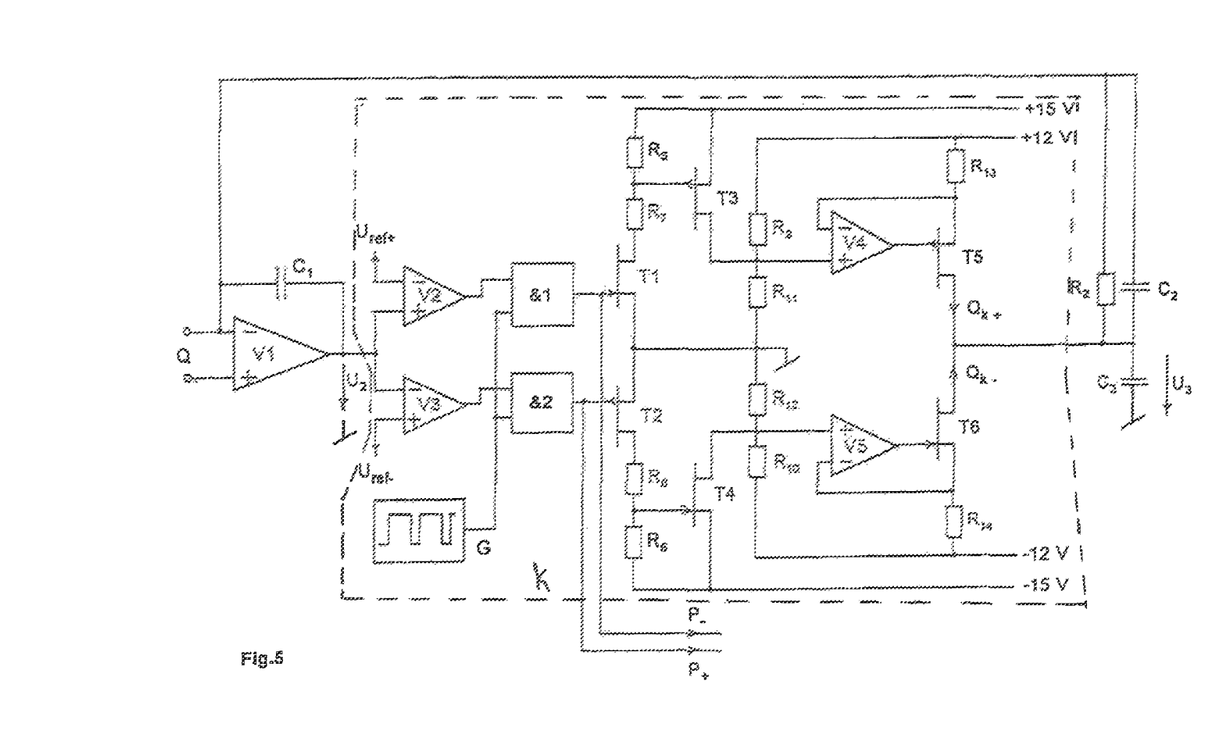
FIG. 5 a preferred embodiment of a circuit according to the invention using transistors.

FIG. 5 shows one of the many possible exemplary embodiments. In this example, which represents an implementation of the schematic circuit according to FIG. 3, the switches S1 and S2 (of FIG. 3) are integrated into the current sources. Both AND gates &1 and &2 on the one hand output the output pulses P+ and P−, and on the other they control the current sources via the transistors T1 to T4. The current sources are formed in a known manner by in each case one amplifier and one transistor.

The six transistors are shown here without differentiation as FET transistors, without regard to whether they are junction FETs or MOSFETs.

When the two AND gates &1 and &2 have the output signal 0, the transistors T1 to T4 are conducting, T5 and T6 are blocked and no compensation charges are generated.

The generation of a compensation charge Qk+ is described as follows: if a positive signal is present at both inputs of &1, the output voltage of &1 is different from 0. &1 should be designed such that its output voltage is then negative. The self-conducting transistor Ti is thereby blocked and as a result, so is the self-blocking transistor T3. At the +input of the amplifier V4, a voltage formed by the voltage divider R9 and R11 is now present. At the resistor R13 therefore, the same voltage is present as at the resistor R9, and the current through this resistor is therefore the desired compensation current. This flows through the transistor T5; after expiry of the opening time of &1 therefore, the compensation charge Qk+ has flowed into the network R2, C2, C3.

If both input voltages at &2 are positive, the output voltage of &2 is different from 0. &2 should be designed such that its output voltage is then positive. At T2, T4, V5 and T6, the generation of the compensation charge Qk− then occurs in the same manner, but with opposite signs.

The convertible measurement range of a conventional amplifier is inversely proportional to the capacitance of the capacitor C1 that is used. With this charge amplifier according to the invention however, the conversion of a large measurement range is now possible, with only ONE capacitor C1 being necessary. The switching between different capacitors C1.1, C1.2, C1.3 . . . of different capacitances in order to be able to capture different measurement ranges is redundant here, because at all times only incremental charges are detected. No special constraints are therefore placed on this capacitor C1, in particular not on its insulation. A loss of charge across C1 is negligible, because the voltage across C1 only remains for a short time and no amplitudes can be present. Therefore, a capacitor C1 with a low capacitance can be chosen. Since capacitors with large capacitances are very voluminous, space is also saved.

Also, R1 can be completely eliminated.

The use of other components than those used here in the examples, which lead to the same objective, are considered to be alternative solutions from the inventor's point of view.

LIST OF REFERENCE MARKS

Q charge source (e.g. a piezoelectric measurement sensor), or the charge Q output thereby respectively.

dQ/dt the current output by the charge source to the amplifier V1.

Cq Electrical capacitance of charge source, cabling and amplifier input.

Rq Insulation resistance of charge source, cabling and amplifier input,

Rz Supply cable resistance, possibly artificially increased by series connection of a fixed resistance to prevent overdriving of the amplifier V1 in the event of a steep rise in charge, if the current that can be supplied to C1 by the amplifier output would otherwise not be sufficient, or if C1 would otherwise have to be made undesirably large.

Iof Offset current of the amplifier V1.

Uoff Offset voltage of the amplifier V1.

L1 total input current, dQ/dt+Iof+Iof/Rq.

U1 Input voltage at the amplifier V1.

V1 high-impedance amplifier.

C1 Feedback capacitor of the amplifier V1. This can in general be chosen to be substantially smaller than in the conventional charge amplifier. It need only be large enough that it can absorb the charge at the input, not yet compensated by the compensation circuit, without the amplifier V1 being overdriven.

U2 Voltage at the amplifier output; due to the compensation circuit this is repeatedly set to a value <|Uref1.

Uref+/Uref− Reference voltages at which the activity of the compensation circuit is triggered.

V2, V3 Amplifiers, which act as comparators for the comparison between U2 and the reference voltages Uref.

G Pulse generator, which supplies pulses of defined width and frequency.

&1, &2 AND gates, which output a positive output signal when both inputs have a positive signal. Their outputs activate the switches S1 and S2.

&3, &4 AND gates, which in the case of a positive output signal at V2 or V3 switch the pulses from the pulse generator G through to the outputs.

S1, S2 Switches, which switch the compensation currents Ik+ and Ik−; in the case of FIG. 3 they also switch the pulses from the pulse generator G through to the outputs.

Ik+, Ik− well-defined current sources, which each supply an exact charge Qk+ or Qk− to the network R2, C2, C3 during the period of a pulse of the pulse generator G.

R2, C2 are used to transmit the compensation charges to the amplifier input, R2 must be chosen low enough that the maximum input error current (Ioff+Uof/Rq) is less than U3 max/R2, since the error current can only flow away through R2.

C3 serves to filter the step changes in the compensation charge and thereby stabilise U3. C3 is advantageously chosen to be less than C2, in order not to have a large effect on the output signal.

U3 Voltage across C3; can vary over the whole permitted control range.

Ü 2-channel transmission path for the output pulses P+ and P−, by galvanic, optical, inductive, capacitive or high-frequency means via transmitter and receiver antenna.

Z Counter for summing the P+ and P−pulses. The counter is advantageously designed for outputting positive and negative values.

D digital counter output, parallel or serial.

R Reset switch for zeroing the counter.

S• Starting switch for starting the counting process.

Qk determines the resolution of the measurement device. If a resolution in e.g. 1000 steps (1%) is required, and if the measurement range is being used to the full, then Qk must be at most $\frac{1}{1000}$ of the maximum input charge. The values Ik and pulse width of the pulse generator G are to be chosen accordingly.

The invention claimed is:

1. Charge amplifier circuit for converting positive and negative charge signals Q that are output by a piezoelectric measuring element into a digital signal D that is proportional to the present measured value at the measuring element, comprising a charge amplifier V1 having a charge input and a voltage output for converting the detected charge Q into a voltage U2, wherein a compensation circuit K comprising two outputs is connected downstream of the voltage output of the charge amplifier V1, wherein the first output is connected to the charge input of the charge amplifier V1 and the second output to a counter Z having two inputs Z+, Z−, and wherein on the one hand, the compensation circuit K can produce a compensation charge Qk+ or Qk− respectively, that is proportional to the voltage U2 and that can be sent to the charge input of the charge amplifier V1 by means of the first output in order to compensate the input signal Q, and wherein on the other hand the compensation circuit can produce a number of pulses P+, P− that is proportional to the magnitude of each compensation charge Qk+ or Qk− produced, and said pulses can be sent to an input Z−, Z+ of the counter Z opposite the sign of the particular compensation charge Qk+ or Qk− by means of the second output, wherein the desired digital signal D, which is proportional to the sum of the charge quanta input beforehand, is available at the output of the counter Z.

2. The circuit according to claim 1, wherein the compensation circuit K comprises a pulse generator G for generating incremental pulses P, the number of which is proportional to the changes in charge at the amplifier input.

3. A charge amplifier circuit for converting positive and negative charge signals Q that are output by a piezoelectric measuring element into a digital signal D that is proportional to the present measured value at the measuring element, comprising a charge amplifier V1 having a charge input and a voltage output for converting the detected charge Q into a voltage U2, wherein a compensation circuit K comprising two outputs is connected downstream of the voltage output of the charge amplifier V1, wherein the first output is connected to the charge input of the charge amplifier V1 and the second output to a counter Z having two inputs Z+, Z−, and wherein on the one hand, the compensation circuit K can produce a compensation charge Qk+ or Qk− respectively, that is proportional to the voltage U2 and that can be sent to the charge input of the charge amplifier V1 by means of the first output in order to compensate the input signal Q, and wherein on the other hand the compensation circuit can produce a number of pulses P+, P− that is proportional to the magnitude of each compensation charge Qk+ or Qk− produced, and said pulses can be sent to an input Z−, Z+ of the counter Z opposite the sign of the particular compensation charge Qk+ or Qk− by means of the second output, wherein the desired digital signal D, which is proportional to the sum of the charge quanta input beforehand, is available at the output of the counter Z,
wherein the compensation circuit K comprises a pulse generator G for generating incremental pulses P, the number of which is proportional to the changes in charge at the amplifier input, and
wherein two AND gates &1, &2 are connected in parallel downstream of the pulse generator G, said gates also being connected at the input side in parallel with the output of the charge amplifier V1 and each being connected at the output side to the input Z− or Z+ of the counter respectively, wherein depending on the sign of U2, the pulses pass through the gate &1 or &2 and can be detected in the counter Z at Z− or Z+.

4. The circuit according to claim 3, wherein two compensation amplifiers V2, V3, which are connected in parallel between the output of the charge amplifier V1 and the AND gates &1 or &2 respectively.

5. The circuit according to claim 4, wherein two current sources Ik+, Ik− for generating the compensation charges Qk+ and Qk−.

6. The circuit according to claim 5, wherein two switches S1, S2 each downstream of one output of the current sources Ik+, Ik−, which are also each connected at the input side to one of the outputs of the AND gates &1, &2, wherein the switches S1, S2 can send current from the current sources Ik+, Ik− to the charge input of the charge amplifier V1 during a pulse duration.

7. The circuit according to claim 6, wherein diodes DI, D2, which are connected downstream to one each of the switches S1, S2 in series.

8. The circuit according to claim 5, wherein two switches S1, S2 downstream of one output each of the current sources Ik+, Ik−, which at the input side are also each connected to one of the outputs of the compensation amplifier V2 and V3, to allow a current to pass from the current source Ik+ in the case of a positive output voltage of the compensation amplifier V2, or from the current source Ik− in the case of a negative output voltage of the compensation amplifier V3.

9. The circuit according to claim 8, wherein transistors or mechanical switches are used as switches, at least in part.

10. The circuit according to claim 1, wherein the counter comprises a reset switch R for resetting the counter to zero and/or a start switch S for starting the counting process.

11. The circuit according to claim 1, further comprising means to enable the counter pulses to be transmitted unmodulated or modulated onto a carrier, galvanically or by inductive or capacitive or optical couplers or transmitter and receiver antennas, to the counter.

12. The circuit according to claim 1, wherein the digital signal D is a voltage signal.

13. Method for converting positive and negative charge signals Q that are output by a piezoelectric measuring element into a digital signal D that is proportional to the present measured value at the measuring element, comprising the steps that: a charge amplifier V1 converts the input charge signal Q into an analogue voltage signal U2, the voltage signal U2 is passed into a compensation circuit K downstream of the charge amplifier V1, on the one hand the compensation circuit K produces a compensation charge Qk+ or Qk− respectively that is proportional to the voltage U2 and, to compensate the input signal Q, sends it to the charge input of the charge amplifier V1 by means of a first output, and that on the other hand the compensation circuit K produces a number of pulses P+, P− that is proportional to the magnitude of each compensation charge $Q_{k+}$ or $Q_{k-}$ produced and sends them to an input Z−, Z+ of the counter Z opposite the sign of the particular compensation charge $Q_{k+}$ or $Q_{k-}$ by means of the second output, and said counter sums the pulses and delivers the respective sum as the desired digital signal D.

* * * * *